United States Patent [19]
Brown et al.

[11] Patent Number: 5,847,951
[45] Date of Patent: Dec. 8, 1998

[54] METHOD AND APPARATUS FOR VOLTAGE REGULATION WITHIN AN INTEGRATED CIRCUIT PACKAGE

[75] Inventors: Alan E. Brown, Georgetown; N. Deepak Swamy, Austin, both of Tex.

[73] Assignee: Dell USA, L.P., Round Rock, Tex.

[21] Appl. No.: 769,644

[22] Filed: Dec. 16, 1996

[51] Int. Cl.⁶ .................................. H05K 1/18
[52] U.S. Cl. ........................... 363/147; 361/762
[58] Field of Search .................... 363/141, 147; 174/52.2; 361/761, 792, 795, 762; 327/565

[56] References Cited

U.S. PATENT DOCUMENTS

| | | | |
|---|---|---|---|
| 4,482,985 | 11/1984 | Itoh et al. | 365/226 |
| 4,730,241 | 3/1988 | Takaya | 363/147 |
| 4,806,844 | 2/1989 | Claydon et al. | 363/147 |
| 5,132,555 | 7/1992 | Takahashi | 307/303 |
| 5,253,156 | 10/1993 | Sakurai et al. | 363/147 |
| 5,321,299 | 6/1994 | Ohkawa et al. | 323/222 |
| 5,355,301 | 10/1994 | Saito et al. | 363/147 |
| 5,384,691 | 1/1995 | Neugebauer et al. | 363/147 |
| 5,541,368 | 7/1996 | Swamy | 361/762 |
| 5,561,592 | 10/1996 | Furutani et al. | 361/738 |
| 5,583,424 | 12/1996 | Sato et al. | 323/282 |
| 5,587,885 | 12/1996 | Swamy | 361/760 |
| 5,602,792 | 2/1997 | Kanaishi | 365/226 |
| 5,694,030 | 12/1997 | Sato et al. | 323/282 |
| 5,774,015 | 6/1998 | Murakami | 327/565 |

*Primary Examiner*—Peter S. Wong
*Assistant Examiner*—Derek J. Jardieu
*Attorney, Agent, or Firm*—Skjerven, Morrill, MacPherson, Franklin & Friel, L.L.P.; Stephen A. Terrile

[57] ABSTRACT

An integrated circuit package comprising an integrated circuit device and a voltage converter circuit both embedded within the package. The voltage converter circuit is configured to convert a standard supply voltage to an operating voltage as required by the integrated circuit device. Also, discrete embedded capacitors may be included to capacitively couple power and ground connections of the integrated circuit device and thus reduce voltage variations during operation of the integrated circuit device. The integrated circuit may package include one or more layers. One or more discrete components or integrated circuits are mounted to one or more layers within the package. Internal conductors on one or more of the layers are configured to connect the components forming the voltage converter circuit. Internal conductors also form connections to the integrated circuit device. The integrated circuit device and voltage converter circuit may be coated with an encapsulant for added protection. The integrated circuit package with embedded voltage converter may be manufactured with processes similar to those used for traditional integrated circuit packages and printed circuit board assemblies.

28 Claims, 5 Drawing Sheets

METHOD AND APPARATUS FOR VOLTAGE REGULATION WITHIN AN INTEGRATED CIRCUIT PACKAGE

FIELD OF THE INVENTION

The present invention relates to integrated circuit packaging, and more particularly to voltage regulation within an integrated circuit package.

DESCRIPTION OF THE RELATED ART

As integrated circuits become more complex and operate at higher levels of performance, maintaining the power source to the integrated circuit (IC) within required operating ranges becomes increasingly difficult. Several of the problems associated with supplying power to modem ICs are described as follows.

Complex integrated circuits operating at high frequencies create high dynamic current transients. These rapid variations in current draw can cause the voltage level to swing sharply at the supply pins to the integrated circuit. The voltage variations propagate from the supply pins to the die itself, and series inductance is created between these two locations. These unwanted voltage variations can propagate throughout the integrated circuit die causing incorrect operation or glitches on the integrated circuit outputs. The problem is exacerbated as operating voltages are lowered, as is the current trend. The finite and ever shrinking noise margins for high performance integrated circuits do not leave much room for power fluctuations. In addition, if the integrated circuit or die is comprised in a socket, additional series inductance is created between the socket and the die.

One source of these unwanted voltage variations is the series impedance in the power supply lines to the integrated circuit. When an integrated circuit rapidly switches current through the supply lines, this series impedance causes large local glitches on the integrated circuit supply lines. Usually the impedance component that has the greatest effect on the magnitude of these glitches is the series inductance of the supply line. The voltage developed in an inductor equals $L \cdot di/dt$, or the inductance times the change in current divided by the change in time. A typical integrated circuit package pin and associated power trace may have an inductance of 20 nH. Thus if 100 mA are switched in 2 nsec, the resulting voltage glitch may be 1 V. Many high performance integrated circuits cannot tolerate supply voltage swings of this magnitude.

On printed circuit boards (PCBs) containing integrated circuit packages soldered to the PCB, this problem of unwanted supply voltage glitches has been traditionally solved by placing bypass capacitors between the power and ground supply pins to an integrated circuit as close as possible to the supply pins. If no bypass capacitors are present, when an integrated circuit switches current into a load, the current comes from the power supply line on the PCB, into the power pin of the integrated circuit package, exits the output pin, and flows through the load into the ground line of the PCB. The series impedance of the supply and ground lines cause the glitches. A bypass capacitor acts as a shock absorber for these glitches by bypassing the series impedance of the supply lines and supplying the fast transient currents to the integrated circuit.

The closer a bypass capacitor is placed to the integrated circuit supply pins, the more series impedance it will bypass, and thus the better it will do its job. In addition to glitch suppression, the bypass capacitors are mounted as closely as possible to the integrated circuit to prevent current loop problems. The bypass capacitor, and the printed circuit board traces that lead to it, form a current loop. This loop acts as an antenna for transmitting radio frequency interference (RFI) generated by the fast current transients. To form the smallest possible RFI antenna, it's important to keep this loop as small as possible.

As the size and operating frequency of integrated circuits have increased, it has become more difficult to properly provide bypass capacitors. The lead length of the capacitors may have a considerable inductive component reducing the effectiveness of the capacitor. Surface mount chip capacitors are used to minimize the effect of capacitor lead length. However, because of the physical constraints of PCBs, the bypass capacitors may be located only so close to the integrated circuit package. The PCB trace length of the power supply lines from the bypass capacitor to the integrated circuit package creates significant series impedance and forms an RFI antenna.

To combat PCB trace length impedance, some advanced integrated circuit packages have bypass capacitors placed directly on the outer surface of the integrated package. However, this solution has several disadvantages. Capacitors mounted on the external surface of an integrated circuit package make attaching an add-on heat sink to the integrated circuit package difficult. At best, the useable area for thermal interface to the heat sink is reduced. Also, capacitors mounted on the external surface of an integrated circuit package increase the overall height of the package and may cause problems in some low profile applications. Furthermore, the electrical connection of capacitors mounted on an exposed package surface may be weakened or lost during PCB assembly processes such as IR reflow. Also, physically exposed capacitors may be subject to other physical and environmental sources of damage.

Another problem associated with supplying power to modern ICs is voltage regulation. As mentioned above, the modern trend is for smaller and smaller voltage supply levels. In modern electronic systems, high performance ICs such as microprocessors may require a different voltage level than other circuits within the system. The common solution is to provide an external voltage converter or regulator near the high performance IC to supply the required voltage so that the rest of the system may be supplied with a standard voltage. However, the use of an external voltage regulator creates additional problems. One such problem is that of trace length impedance, as described above. The further the voltage regulator is located from the high performance IC, the longer the trace length which supplies the regulated voltage to the IC. A long voltage supply trace length may cause voltage variations due to the increased impedance. These $L \cdot di/dt$ variations will increase as the speed of the high performance IC increases. In addition, as the regulated voltage level decreases, the maximum level of variations which may be tolerated also decreases. Since the modern trend is to decrease operating voltage and increase operating speed, these voltage variations become a severe problem in modern electronic systems.

Another problem created by the addition of external voltage regulators is an increase in RFI/EMI problems. The additional voltage regulator circuitry and the increasingly high frequency switching currents may radiate a large amount of electromagnetic interference. The common solution to both the $L \cdot di/dt$ and RFI/EMI problems is to locate the voltage regulator circuitry as close to the high performance IC as possible. This solution reduces the overall length of the power supply traces to the high performance IC. By reducing the power supply trace length, the trace impedance is lowered, thus reducing the voltage variations created by high switching currents. Additionally, reducing the length of the power supply traces reduces the effective antenna area for RFI/EMI radiation. However, because of the physical size of the voltage regulator's components, the circuitry can only be located so close to the high performance IC.

Another problem created by the addition of voltage regulator circuitry to high performance IC designs is thermal management. Even though modern voltage regulator circuits may be 90% to 95% efficient, they still must dissipate a significant amount of heat. For example, a voltage regulator circuit in a design for an Intel P6 microprocessor may dissipate roughly 3.50 watts of heat. This is a significant amount of heat to be dissipated by the small packages used in most voltage regulator circuit designs. Therefore, it is common for such regulator circuits to require added heat sinks to control the elevated temperatures. These additional heat sinks increase the size and cost of the voltage regulator circuits. The required additional heat sinks are often quite large and may create height restriction and space restriction problems in some designs.

Another problem created by addition of voltage regulator circuits to high performance IC designs is thermal analysis. Because the voltage regulator circuit is an additional heat source in the system the overall thermal analysis becomes more complicated. Traditional thermal management solutions may need to be redesigned to handle such additional heat sources.

Yet another problem associated with external voltage regulator circuits is decreased system reliability due to the increased component. High performance IC designs using external voltage regulators require more components than traditional IC designs. This increased number of components inherently lowers reliability and complicates the overall system design. This problem is further aggravated by the addition of extra thermal management solutions such as heat sinks. Large heat sinks may provide physical extrusion which are easily damaged during manufacturing, shipping or handling. Also, the added voltage regulator components use more board space than traditional IC designs. In modern complicated electronic systems board space is often at a premium.

All of the above described problems are aggravated in systems with more than one IC requiring external voltage regulation. Such systems include systems with numerous high performance IC's and multi-processor systems in which each processor requires voltage regulation.

Thus, a solution is desired for locating bypass capacitors and voltage regulator circuits as closely as possible to the high performance integrated circuits to which they supply power. Furthermore, it is desired that such a solution not significantly affect the physical dimensions of the high performance IC package. It is desired to have such a solution that does not interfere with the integrated circuit package interface to a heat sink, negatively impact the physical height of the package, or interfere with any other external package requirements. Additionally, it is desired that such a solution simplify the overall system thermal management. Also, it is desired to improve system reliability and simplify board designs and conserve space. Furthermore, it is desired to improve the overall power supply quality and maintain compatibility with the existing cost effective and quality integrated packaging technologies suitable for volume production.

SUMMARY OF THE INVENTION

The present invention comprises an integrated circuit package including an integrated circuit device and a voltage converter circuit both embedded within the package. The voltage converter circuit is configured to convert a standard supply voltage to an operating voltage as required by the integrated circuit device. The voltage converter circuit may be implemented as a combination of discrete and integrated components. Also, discrete embedded capacitors may be included to capacitively couple power and ground connections of the integrated circuit device and thus reduce voltage variations during operation of the integrated circuit device. The integrated circuit package includes one or more layers, and the integrated circuit device and voltage converter circuit may be bonded to one or more layers within the package. Also, one or more discrete components may be mounted to one or more layers within the package. Internal conductors on one or more of the layers are configured to connect the discrete and integrated voltage converter components and form connections to the power and ground connections of the integrated circuit device. The internal conductors also connect the integrated circuit device to the external I/O pins of the package. Vias may be used to connect conductors on different layers or on different sides of a layer. The integrated circuit device and voltage converter circuit may be coated with an encapsulant for added protection.

The present invention further contemplates a method for fabricating an integrated circuit package with an integrated circuit device and a voltage converter circuit both embedded within the package. The method includes forming package layers from sheets of a dielectric material. The layers may include conductors, pads, and vias. The layers are laminated together to form a package body. Depending upon the material, the laminated package body may be cured by firing at a high temperature. One or more discrete components are soldered to pads on one or more layers and the integrated circuit device and integrated voltage converter circuit are bonded to pads on one or more layers. Internal conductors form the electrical connections between voltage converter components and the integrated circuit device. Internal power and ground conductor planes may be formed between layers and coupled discrete capacitors. Pins are attached to the package and connected to the integrated circuit device by the internal conductors. The integrated circuit device and voltage converter circuit are preferably encapsulated for further protection. The package may form a substantially hermetic seal around the integrated circuit device and voltage converter circuit.

An integrated circuit package according to the present invention provides improved voltage regulation to a high performance integrated circuit device and reduces overall system component count and size while simplifying thermal management. The improved package is preferably similar in form to traditional packages so that the improved package is compatible with height or size restrictions for traditional packages and may use standard heat sinks.

BRIEF DESCRIPTION OF THE DRAWINGS

A better understanding of the invention may be obtained when the following detailed description is considered in conjunction with the following drawings, in which.

DETAILED DESCRIPTION OF THE INVENTION

Figure 1:
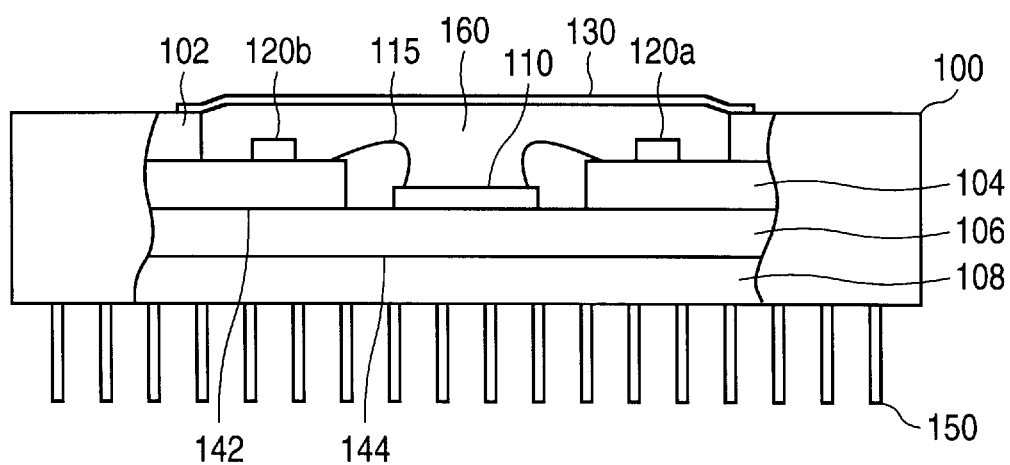
FIG. 1 is a diagram illustrating a cut-away side view of an integrated circuit package according to one embodiment of the present invention.
Figure 2:
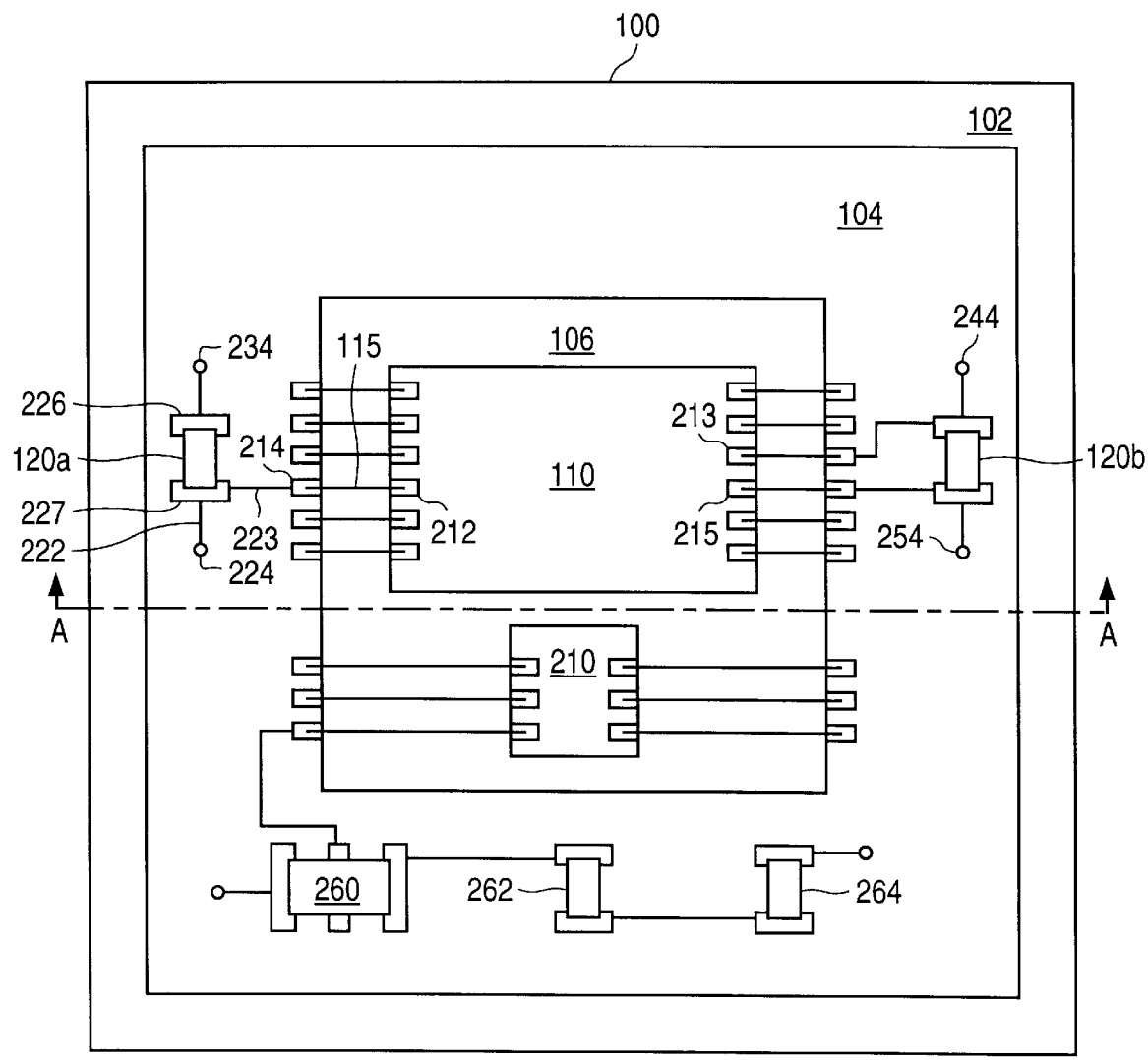
FIG. 2 is a top-view of an integrated circuit package according to one embodiment of the present invention.

Referring to FIG. 1, a partially cut-away side view of an integrated circuit package according to one embodiment is illustrated. Referring now to FIG. 2, a top view of the integrated circuit package of FIG. 1 is shown. When viewed together, FIGS. 1 and 2 provide for a better understanding of the details of one embodiment of the present invention. Note that the direction of observation in FIG. 1 is shown by the cutaway line A in FIG. 2. Note also that because of the direction of observation, some of the components visible in FIG. 2 are not visible in FIG. 1.

Now, referring collectively to FIGS. 1 and 2, an integrated circuit package is illustrated including several layers 102, 104, 106, 108 laminated together to form a package body 100. The layers 102, 104, 106, 108 are comprised of a dielectric material which may be formed from a substantially ceramic material. In other embodiments the layers 102, 104, 106, 108 are formed from a dielectric material such as epoxy, FR-4, or polymide. It can be appreciated that the layers 102, 104, 106, 108 may be formed from a number of different dielectric materials. For embodiments using a substantially ceramic layer material, the laminated layers 102, 104, 106, 108 are cured by firing at a high temperature, such as 1600° C., to create a monolithic sintered package body 100.

A cavity is formed in some of the layers 102, 104 before laminating to provide areas to mount internal components. An integrated circuit device 110 is mounted in the cavity on one of the layers 106. The integrated circuit device 110 is bonded to one of the layers 104 with bonding wires, such as bonding wire 115. The bonding wires 115 are preferably comprised substantially of gold. The integrated circuit device comprises connection pads, such as connection pad 212. It is noted that only connection pads necessary for an understanding of the invention are shown in FIG. 2, and embodiments may have fewer or more connection pads than illustrated in FIG. 2. The layer 104 to which the integrated circuit 110 device is bonded includes corresponding conductor pads, such as conductor pad 214. One end of the bond wire 115 is attached to the integrated circuit device connection pad 212 and the other end is attached to the corresponding conductor pad 214. The attachment is performed using a suitable interconnection means such as thermosonic ball-wedge wire bonding. The bonding of the integrated circuit device to the layer 104 is described above in terms of wire bond 115, connection pad 212, and corresponding conductor pad 214. However, it is noted that the above bonding description essentially applies to the entire wire bonding of the integrated circuit 110 to package layer 104.

Discrete capacitors 120a, 120b are mounted on layer 104. Discrete capacitor 120a is soldered to conductor pads 226 and 227. Discrete capacitor 120b is soldered to similar conductor pads on layer 104. Internal conductors, such as internal conductors 222 and 223, are formed on one or more of the layers 102, 104, 106, 108. In some embodiments internal conductors may be located between layers. The internal conductors are configured to electrically connect the conductor pads with the appropriate integrated circuit device connection pads and the appropriate external pins 150. For example, integrated circuit device connection pad 212 is wire bonded to conductor pad 214. Internal conductor 223 electrically connects conductor pad 214 to conductor pad 227 and thus to one terminal of discrete capacitor 120a. Internal conductor 222 electrically connects the conductor pad 227 to a via 224 which electrically connects to one of the external pins 150. In some embodiments vias, such as via 224, may connect internal conductors between layers as well as to external pins.

A power conductor plane 142 is formed between layers 104 and 106, and a ground conductor plane 144 is formed between layers 106 and 108. The discrete capacitors 102a and 120b are electrically connected to the power conductor plane 142 and the ground conductor plane 144. Discrete capacitor 120a is electrically connected to the power plane 142 by via 224 and to the ground plane 144 by via 234. Discrete capacitor 120b is electrically connected to the power plane 142 by via 244 and to the ground plane 144 by via 254. The vias 224, 234, 244, 254 are shown in FIG. 2 only.

In this embodiment, integrated circuit device connection pads 212 and 213 are power supply pads and integrated circuit device connection pad 215 is a ground supply pad for the integrated circuit device 110. The discrete capacitors 120a, 120b capacitively couple the power plane 142 to the ground plane 144 at points extremely close to the power and ground supply pads 212, 213, 215. The discrete capacitors 120a, 120b are much closer to the integrated circuit power and ground supply pads 212, 213, 215 than comparable discrete capacitors located external to the integrated circuit package. Thus, the discrete capacitors are configured to bypass a substantial amount of the conductor (line) impedance associated with the supply pads 212, 213, 215. A low power supply conductor impedance allows high frequency transient currents to be rapidly sourced without resulting in harmful voltage swings. Therefore, the discrete capacitors 212, 213 are configured to substantially reduce voltage variations and high frequency current transients during operation of the integrated circuit.

An integrated switching regulator controller circuit 210 is also mounted in the cavity on one of the layers 106. The integrated switching regulator controller circuit 210 is electrically connected to one of the layers 104 similarly to the integrated circuit device 110 with bonding wires. The bonding wires connect pads on the integrated switching regulator controller circuit to bonding pads on one of the layers 104. It is noted that the connection pads shown in FIG. 2 for the integrated switching regulator controller circuit 210 are only illustrative of one configuration. Many other configurations are within the scope of this invention. As described above for the integrated circuit device 110, various wire bonding techniques and wire bonding configurations, such as bonding to multiple layers may be used.

The integrated switching regulator controller circuit 210 is electrically connected to other discrete components by internal conductors to create a voltage converter circuit. Such additional discrete components include a power transistor 260, an inductor 262, and a capacitor 264. These discrete components are mounted on layer 104 and are soldered to conductor pads as described above for the discrete capacitors 120A, 120B. Internal conductors formed on the layers 102, 104, 106, 108 connect the discrete components and the integrated switching regulator controller circuit to form a voltage converter circuit. Vias may be used to form electrical connections among internal conductors between layers 102, 104, 106, 108. The operation and configuration of the voltage converter circuit formed from the integrated switching regulator circuit 210 and the power transistor 260, inductor 262, and capacitor 264 is described below. It is noted that the components 260, 262, 264 and 210 shown in FIG. 2 are only representative of the components which may be used to form a voltage converter circuit. Other configurations are within the scope of this invention.

Generally, the voltage converter circuit operates to convert a standard supply voltage to an operating voltage for the integrated circuit device 110. The standard supply voltage is received from one of the external conductor pins 150 and connected to the voltage converter circuit by internal conductors on the layers 102, 104, 106, 108. The voltage converter circuit operates as a step down or buck converter to lower the standard supply voltage to an appropriate operating voltage for the integrated circuit device 110. For example, a standard supply voltage may be 5 volts and the required operating voltage may be 3volts. Typically, an LC filter, such as one formed by inductor 262 and capacitor 264, is used to smooth the reduced DC voltage created by operation of the switching regulator controller 210 and the power transistor 260. The filtered operating voltage is then connected to the power conductor plane 142 and thus connected to the integrated circuit device 110. Vias and internal conductors are used to form these connections.

The cavity formed in layers 102 and 104 is filled with an encapsulant 160. The encapsulant 160 coats the integrated circuit device 110, the integrated switching regulator controller circuit 210 and the discrete components 120a, 120b, 260, 262, 264. The encapsulant 160 provides additional protection against environmental hazards such as moisture. The encapsulant 160 may be a polymer material. In other embodiments, the encapsulant 160 is a molded plastic. A lid 130 is sealed to the outer surface oflayer 102. The lid 130 and laminated layers 102, 104, 106, 108 provide a substantially hermetic package for the integrated circuit device 110.

It is noted that the present invention may comprise various embodiments. For example, the number of layers may be varied as well as the orientation of the integrated circuits and discrete components on the layers. In other embodiments, the integrated circuit device 110 and/or integrated switching regulator controller circuit 210 are wire bonded to more than one of the layers. Alternatively, the integrated circuit device 110 and/or integrated switching regulator controller circuit 210 are bonded to a layer by direct soldering (flip chip) or similar methods. It is noted that the invention is not limited by the type of integrated circuit device, however, the invention is most advantageous for high performance circuits integrated on a semiconductor die, wherein the integrated circuits operate at high frequencies, such as 60 MHz. Furthermore, other embodiments may include fewer or more discrete components than described in the foregoing embodiment. Also, other types of passive components, such as resistors or ferrites, may be embedded within the integrated circuit package similarly to the discrete capacitors, inductors, and transistors as described above. Additionally, the integrated circuit device and passive components may be mounted on different layers. It should be appreciated that many variations and permutations of the foregoing described embodiment exist within the scope and spirit of the present invention.

Figure 3:
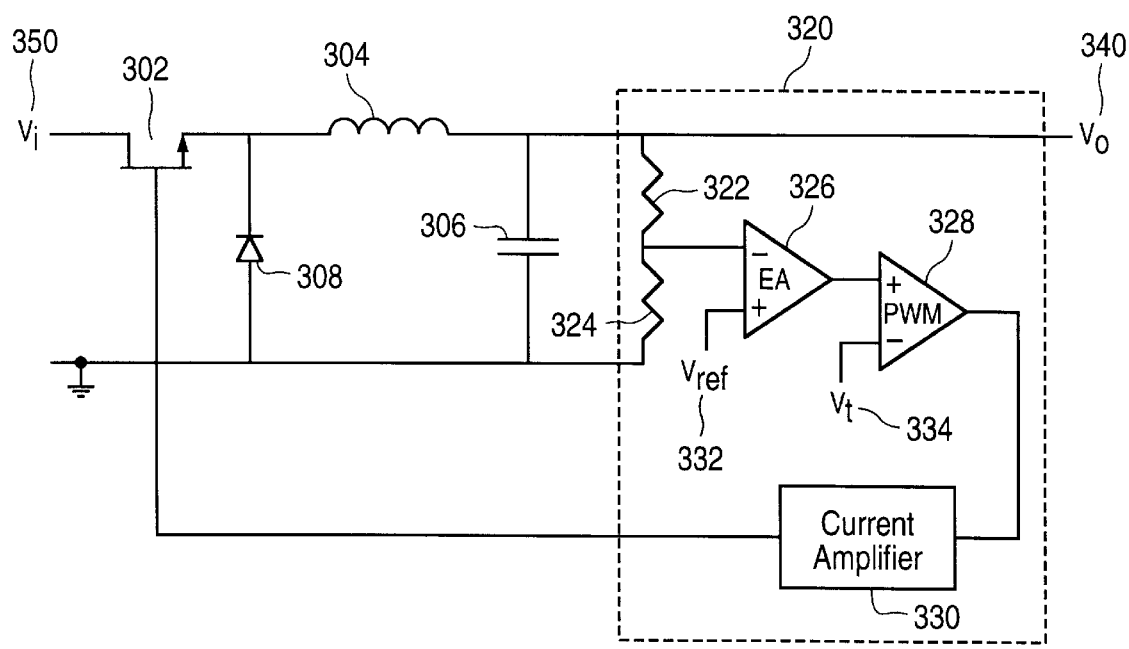
FIG. 3 is a schematic diagram illustrating a voltage regulator circuit that may be used according to one embodiment of the present invention.

Referring now to FIG. 3, a schematic diagram of a DC to DC step down converter, or buck converter, is shown. This voltage converter is illustrative of the type of voltage converter referred to in the discussion of FIG. 2 above. The operation of this type of voltage converter is described as follows.

The standard supply voltage 350 is received at the input terminal of the power transistor 302. The output of the power transistor 302 is connected to an inductor 304 and to the cathode of a clamp diode 308. The inductor 304 is combined with a capacitor 306 to form an LC filter. The output voltage 340 is sensed through the voltage divider consisting of resistors 322 and 324 by the error amplifier 326. The error amplifier 326 also receives a reference voltage 332. The output of the error amplifier 326 is received by a pulse width modulator 328. The pulse width modulator 328 also receives a sawtooth voltage waveform 334. The output of the pulse width modulator 328 is amplified by the current amplifier 330 and then received by the control terminal of the power transistor 302.

The voltage converter operates as a switching regulator by switching the DC input voltage 350 through the power transistor 302 at an adjustable duty cycle. By varying the duty cycle, the average DC voltage delivered at the output 340 may be controlled. The output voltage is sensed by the error amplifier 326. The output of the error amplifier 326 changes proportionally to the output voltage level. For example, as the output voltage 340 decreases in response to an increased output load, the error amplifier 326 output will increase proportionally. The output of the error amplifier 326 is compared to a sawtooth voltage waveform 334 by the pulse width modulator 328. The output of the pulse width modulator 328 is thus a square waveform. The duty cycle of this square waveform varies in response to changes in the output voltage 340. This modulated waveform is used to control the power transistor 302. For example, if the voltage output 340 drops, the duty cycle of the modulated waveform will increase resulting in a longer on-time for the power transistor 302. Therefore, the voltage at the output terminal of the power transistor 302 will be high for a longer period of time. The LC filter composed of inductor 304 and capacitor 306 then averages the voltage waveform from the power transistor to create the output voltage 340. Ignoring device losses, the output voltage 340 is thus approximately equal to the input voltage 350 times the proportion of time in which the power transistor 302 is turned on by the modulated waveform from the pulse width modulator 328. The proportion of time in which the power transistor 302 is turned on is adjusted in response to variations in the output voltage 340 by modulating the duty cycle of the modulated waveform output from the pulse width modulator 328. The duty cycle may also be changed by varying the reference voltage 332.

The base value of the output voltage 340 may be changed by adjusting the values of the components of the voltage converter circuit in FIG. 3, or by changing the value of the reference voltage 332. Therefore, during fabrication of an integrated circuit package such as in FIGS. 1 and 2, the imbedded voltage converter circuit may be adjusted to convert the standard supply voltage to any desired operating voltage. This feature allows a simple process to create different voltage versions of the same integrated device package.

It is noted that the step down voltage converter of FIGS. 3 is a simplified version of such voltage converters. Different types of voltage converters and more complicated step down converters may easily be used within the scope of this invention.

Many of the components comprising the voltage converter circuit shown in FIG. 3 may be integrated into an integrated circuit die. For example, the devices within the dashed box 320 are commonly included in a single integrated circuit. This type of integrated circuit is often referred to as a switching regulator controller circuit, such as element 210 of FIG. 2. In other embodiments of the present invention, more or fewer of the components may be combined into a single integrated circuit, or alternatively, may be implemented as discrete components.

Figure 4:
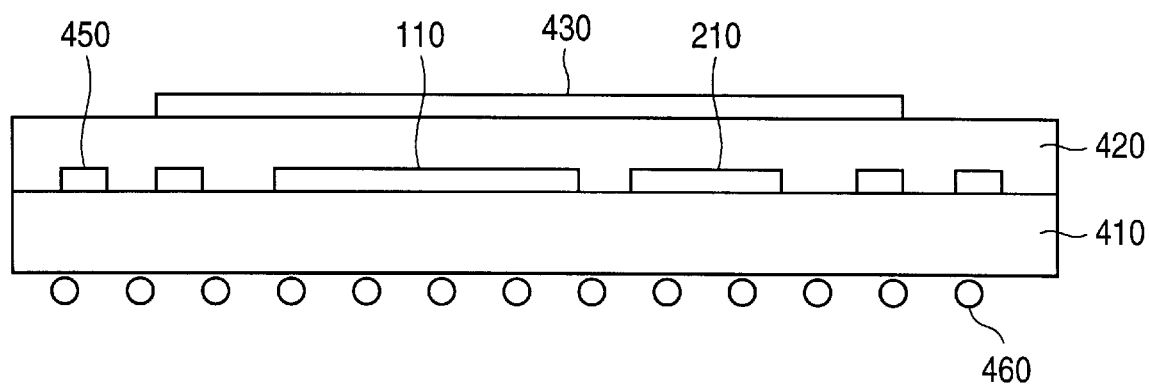
FIG. 4 is a schematic diagram illustrating a cross-sectional side view of an integrated circuit package according to one embodiment of the present invention.

Referring to FIG. 4, an alternate embodiment is shown illustrating a cross-sectional side view of an integrated circuit package. The integrated circuit package includes a substrate layer 410. An integrated circuit device 110 and an integrated switching regulator controller circuit 210 are attached to the substrate layer 410. Discrete components 450 are also attached to the substrate layer 410 to form the rest of the voltage converter circuit and bypass capacitors. The integrated circuit device 110 and discrete components 450 are also embedded within an encapsulating layer 420. The integrated circuits 110 and 210 are bonded to pads on the substrate 410 by wire-bonding, flip-chip, or other suitable means. The discrete components 450 are soldered to pads on the substrate 410. Internal conductors are formed on the substrate to electrically connect the discrete components 450 to connection pads for the integrated circuits 110 and 210. The switching regulator controller circuit 210 and some of the discrete components 450 form a DC-to-DC voltage converter. This voltage converter operates to convert a standard supply voltage received by the package to an operating voltage for the integrated circuit 110. Some of the discrete components 450 may be configured to capacitively couple the power and ground pads of the integrated circuit device 110. These capacitors operate to reduce voltage variations and high frequency switching transients during operation of the integrated circuit device 110.

Internal conductors formed on the substrate 410 also connect the integrated circuit devices 110, 210 to external conductors, such as a solder ball array 460. In one embodiment conductors are formed on both sides of the substrate 410 and vias are used to connect conductors between sides. A heat spreader device 430 is preferably attached to one surface of the integrated circuit package.

Figure 5:
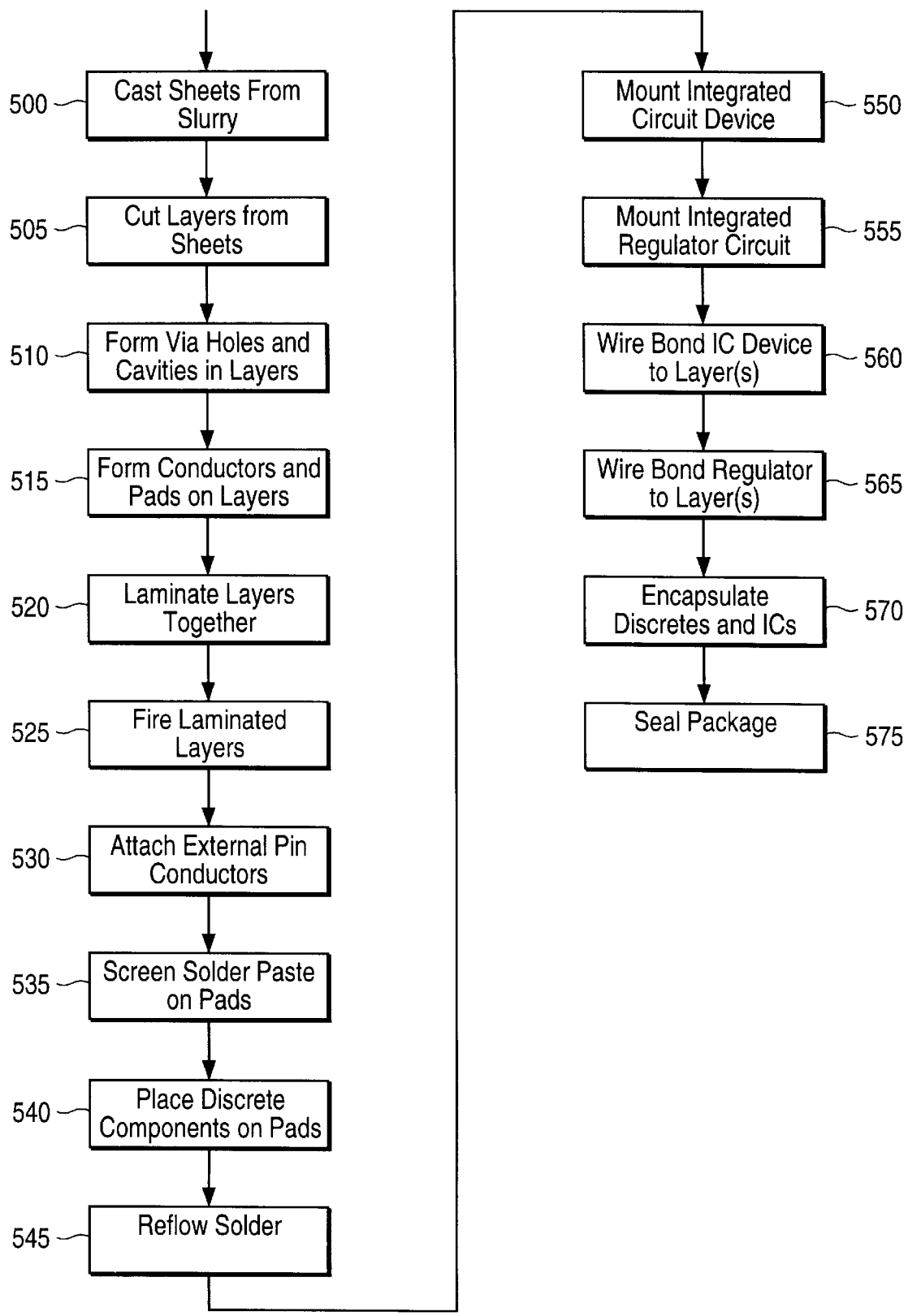
FIG. 5 is a flowchart diagram illustrating a method of fabricating an integrated circuit package according to one embodiment of the present invention.

Referring now to FIG. 5, a flowchart diagram is shown illustrating a method for manufacturing an embodiment of the present invention. A dispersion or slurry of ceramic powder in a liquid vehicle is cast into thin sheets 500. The sheets are then dried. The dried sheets are commonly referred to as green-sheets or being in the green-tape stage. Via holes (vias) and cavities are formed in the dried sheets 510. The via holes may be filed with metal. Conductor traces, pads, and planes may be formed on the sheets 515. The conductors are formed by a suitable printing process, such as screening or etching. Package layers are cut from the sheets 505. The layers are precisely aligned and laminated together to form a package body 520. The laminated layers are fired in a reducing atmosphere at a high temperature, such as 1600° C., to form a monolithic sintered package body 525. External pin conductors are attached to the package 530. For other embodiments, other types of external conductors may be used, such as conductor pads or balls formed on the outer surface of the bottom layer. The attaching 530 may include nickel plating and brazing steps. Finishing steps, such as grinding, may be applied to the package to smooth or shape the package body.

Solder paste is applied to some or all of the pads by a suitable process, such as screening 535. The pads may be on different layers exposed by a cavity formed (510) in some of the layers. Discrete components, such as discrete transistors and capacitors, are placed on the pads 540, and the solder is reflowed by a suitable process, such as IR reflow 545. These discrete components may form part of a voltage converter circuit and/or bypass capacitors. Equipment similar to that used for conventional printed circuit board (PCB) assembly may be used for the screening 535, placing 540, and reflowing 545 steps.

An integrated circuit device is mounted in the package body on one of the layers 550. An integrated switching regulator controller circuit for a power converter is also mounted on one of the layers 555 The integrated circuit device and integrated regulator are wire bonded to conductor pads on one or more of the layers 560, 565. Wire bonding is performed by a suitable process, such as gold thermosonic ball-wedge wire bonding. The bond wires are typically substantially gold. Other bonding processes, such as flip-chip, may also be used. The integrated circuit device and passive components are encapsulated 570 to provide protection against environmental hazards such as moisture. A suitable material, such as a polymer or molded plastic, may be used for encapsulating. The package is sealed 575 to provide a substantially hermetic integrated circuit package. The package may be sealed with a lid which may be sealed to the outer surface of the top layer by a brazing process.

The method described above may have various embodiments. For example, the aforedescribed method may be modified to use different type of materials. Other modification may be made to the method to produce a package with embedded discrete capacitors but having a different structure than the package resulting from the above method. Other processes which may be modified within the scope and spirit of this invention to embed discrete components within an integrated circuit package are described in chapter 6 of *Electronic Packaging and Interconnection Handbook*, Harper, Charles, A. ed., New York: McGraw Hill, Inc. 1991, which is hereby incorporated by reference. It should be appreciated that many variations and permutations of the foregoing described embodiment exist within the scope and spirit of the present invention.

An integrated circuit package manufacture according to one embodiment provides an integrated circuit package with a voltage converter and discrete capacitors embedded within the package. The voltage converter operates to convert a standard operating voltage to an operating voltage as required by the IC device within the package. By changing component values during the aforedescribed manufacturing process, different operating voltage levels may be programmed. The embedded discrete capacitors provide very close capacitive coupling of the integrated circuit's power and ground connections. This close coupling prevents adverse voltage variations and high frequency switching transients during operation of the integrated circuit device. The discrete components are preferably embedded within the integrated circuit package without causing external protrusions that would interfere with heat sink attachment or system height restrictions. By the present invention, an integrated circuit package with embedded voltage converter and capacitors may be fabricated to a form-factor similar to traditional integrated circuit packages.

The above descriptions of the present invention are not intended to be limited to the specific form set forth herein, but on the contrary, they are intended to cover such alternatives, modifications, and equivalents, as can be reasonably included within the spirit and scope of the invention as defined by the appended claims.

What is claimed:

1. A package for an integrated circuit device, the package comprising:

a plurality of layers laminated together to form a package body;

a plurality of external conductors attached to said package body;

a plurality of internal conductors on at least one of said layers, wherein at least one of said plurality of internal conductors is electrically coupled to at least one of said plurality of external conductors;

an integrated circuit device embedded within said package body, said integrated circuit device electrically coupled to at least one of said plurality of internal conductors, and wherein said integrated circuit device comprises at least one connection for receiving an operating voltage; and a voltage converter circuit embedded within said package body, wherein said voltage converter circuit comprises an input for receiving a standard supply voltage and an output for providing said operating voltage, and wherein said voltage converter circuit is electrically coupled to at least one of said plurality of internal conductors;

wherein said output for providing said operating voltage from said voltage converter circuit is electrically coupled to said at least one connection for receiving an operating voltage for said integrated circuit device; and wherein at least one of said plurality of external conductors is adapted to receive said standard supply voltage, and said input for receiving a standard supply voltage to said voltage converter circuit is electrically coupled to said at least one of said plurality of external conductors adapted to receive said standard supply voltage.

2. The package of claim 1, wherein said voltage converter circuit comprises a switching type DC-to-DC buck topology.

3. The package of claim 1, wherein said voltage converter circuit comprises:

an integrated switching regulator controller circuit configured to provide a regulator signal;

at least one power transistor comprising an input connection, an output connection, and a control connection, wherein said regulator signal is electrically coupled to said power transistor control connection and said input for receiving a standard supply voltage is electrically coupled to said power transistor input connection; and an LC filter electrically coupled to said power transistor output connection, wherein said LC filter is configured to provide said operating voltage to said output for providing said operating voltage.

4. The package of claim 3, wherein said integrated switching regulator controller circuit, said at least one power transistor, and said LC filter are electrically coupled by ones of said plurality of internal conductors.

5. The package of claim 3, wherein said integrated circuit device and said integrated switching regulator controller circuit each comprise a plurality of connection pads, and wherein ones of said plurality of connection pads are wire bonded to corresponding ones of said plurality of conductor pads located on at least one of said plurality of layers, wherein said ones of said plurality of conductor pads are coupled to ones of said plurality of internal conductors.

6. The package of claim 3, wherein said at least one power transistor and said LC filter each comprise at least one terminal, and wherein each said at least one terminal is soldered to a corresponding conductor pad, wherein each said corresponding conductor pad is located on one of said plurality of layers.

7. The package of claim 1, further comprising:

a first conductor plane located on one of said plurality of layers and electrically coupled to said output for providing said operating voltage from said voltage converter circuit; and wherein said at least one connection for receiving an operating voltage to said integrated circuit device is electrically coupled to said first conductor plane.

8. The package of claim 1, further comprising:

at least one discrete capacitor embedded within said package body;

wherein said integrated circuit device further comprises at least one ground connection, and wherein said at least one discrete capacitor capacitively couples said at least one ground connection to said at least one connection for receiving an operating voltage.

9. The package of claim 8, further comprising:

a first conductor plane located on one of said plurality of layers, wherein said first conductor plane is electrically coupled to said at least one discrete capacitor, to said output for providing said operating voltage from said voltage converter circuit, and to said at least one connection for receiving an operating voltage for said integrated circuit device;

a second conductor plane located on a different one of said plurality of layers than said first conductor plane, said second conductor plane electrically coupled to said at least one discrete capacitor and to said at least one ground connection of said integrated circuit device; and wherein said at least one discrete capacitor capacitively couples said first conductor plane and said second conductor plane.

10. The package of claim 1, further comprising vias formed through at least one of said layers, wherein said vias are adapted to electrically couple ones of said plurality of internal conductors.

11. The package of claim 1, further comprising an encapsulant coating said integrated circuit device.

12. The package of claim 1, further comprising an encapsulant coating said integrated circuit device and said voltage converter circuit.

13. The package of claim 1, wherein each one of said plurality of layers is comprised of a substantially dielectric material.

14. The package of claim 13, wherein said dielectric material comprises epoxy, FR-4, or polymide.

15. The package of claim 1, wherein each one of said plurality of layers is comprised of a substantially ceramic material.

16. The package of claim 15, wherein said plurality of layers are cured by firing at a high temperature, such as 1600 degrees Celsius, to create a monolithic sintered package body.

17. The package of claim 1, wherein said package is substantially hermetically sealed.

18. The package of claim 1, wherein a cavity is formed within said plurality of layers.

19. The package of claim 18, wherein said integrated circuit device is mounted within said cavity.

20. The package of claim 18, wherein said voltage converter circuit is mounted within said cavity.

21. The package of claim 18, wherein a plurality of discrete capacitors are mounted in said cavity.

22. The package of claim 1, wherein the integrated circuit device is bonded to one of said plurality of layers with bonding wire.

23. The package of claim 22, wherein the bonding wire is comprised substantially of gold.

24. The package of claim 1, wherein a plurality of external pins is electrically coupled to ones of said plurality of internal conductors.

25. A package for an integrated circuit device, the package comprising:

at least one package substrate layer having opposing surfaces;

a plurality of external conductors attached to said package;

a plurality of internal conductors on at least one of said opposing surfaces of said at least one package substrate layer, wherein at least one of said plurality of internal conductors is electrically coupled to at least one of said plurality of external conductors;

an integrated circuit device mounted on said package substrate layer, said integrated circuit device electrically coupled to at least one of said plurality of internal conductors, and wherein said integrated circuit device has a power connection and a ground connection;

a voltage converter circuit mounted on said package substrate layer, wherein said voltage converter circuit is configured to convert a standard supply voltage to an operating voltage and supply said operating voltage to said integrated circuit power connection to said integrated circuit ground connection; and an encapsulant configured to cover said integrated circuit device and said at least one discrete capacitor.

26. The package of claim 25, further comprising vias formed through said at least one package substrate layer, wherein said vias are adapted to electrically couple ones of said plurality of internal conductors.

27. The package of claim 25, wherein said encapsulant comprises a polymer material.

28. The package of claim 25, wherein said encapsulant comprises a molded plastic material.

* * * * *